United States Patent
Suzuki et al.

(10) Patent No.: US 9,647,021 B2
(45) Date of Patent: May 9, 2017

(54) SEMICONDUCTOR DEVICE MANUFACTURING METHOD

(71) Applicant: CANON KABUSHIKI KAISHA, Tokyo (JP)

(72) Inventors: Sho Suzuki, Yamato (JP); Takehito Okabe, Atsugi (JP); Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 14/731,077

(22) Filed: Jun. 4, 2015

(65) Prior Publication Data

US 2015/0270301 A1 Sep. 24, 2015

Related U.S. Application Data

(62) Division of application No. 13/366,155, filed on Feb. 3, 2012, now Pat. No. 9,129,877.

(30) Foreign Application Priority Data

Feb. 9, 2011 (JP) .................................. 2011-026354
Oct. 7, 2011 (JP) .................................. 2011-223294

(51) Int. Cl.
*H01L 27/00* (2006.01)
*H01L 27/146* (2006.01)

(52) U.S. Cl.
CPC .. *H01L 27/14625* (2013.01); *H01L 27/14609* (2013.01); *H01L 27/14627* (2013.01); *H01L 27/14629* (2013.01); *H01L 27/14636* (2013.01); *H01L 27/14687* (2013.01)

(58) Field of Classification Search
CPC ......... H01L 27/14609; H01L 27/14627; H01L 27/14636; H01L 27/14687; H01L 27/14625; H01L 27/14629
See application file for complete search history.

(56) References Cited

U.S. PATENT DOCUMENTS

| | | | | |
|---|---|---|---|---|
| 7,442,973 | B2* | 10/2008 | Komoguchi | H01L 27/14601 257/291 |
| 8,648,435 | B2* | 2/2014 | Konno | H01L 27/14625 257/294 |
| 2006/0141653 | A1* | 6/2006 | Choi | H01L 27/14621 438/48 |
| 2006/0183265 | A1* | 8/2006 | Oh | H01L 27/14632 438/65 |
| 2010/0025571 | A1* | 2/2010 | Toumiya | H01L 27/14625 250/208.1 |
| 2010/0078745 | A1* | 4/2010 | Wano | H01L 27/14629 257/432 |
| 2010/0244167 | A1* | 9/2010 | Konno | H01L 27/14625 257/432 |

FOREIGN PATENT DOCUMENTS

JP 2006093402 * 4/2006 ............. H01L 23/52

* cited by examiner

*Primary Examiner* — Kimberly Rizkallah
*Assistant Examiner* — Alexander Belousov
(74) *Attorney, Agent, or Firm* — Canon U.S.A., Inc. IP Division

(57) ABSTRACT

A first waveguide member is formed, as viewed from above, in an image pickup region and a peripheral region of a semiconductor substrate. A part of the first waveguide member, which part is disposed in the peripheral region, is removed. A flattening step is then performed to flatten a surface of the first waveguide member on the side opposite to the semiconductor substrate.

49 Claims, 6 Drawing Sheets

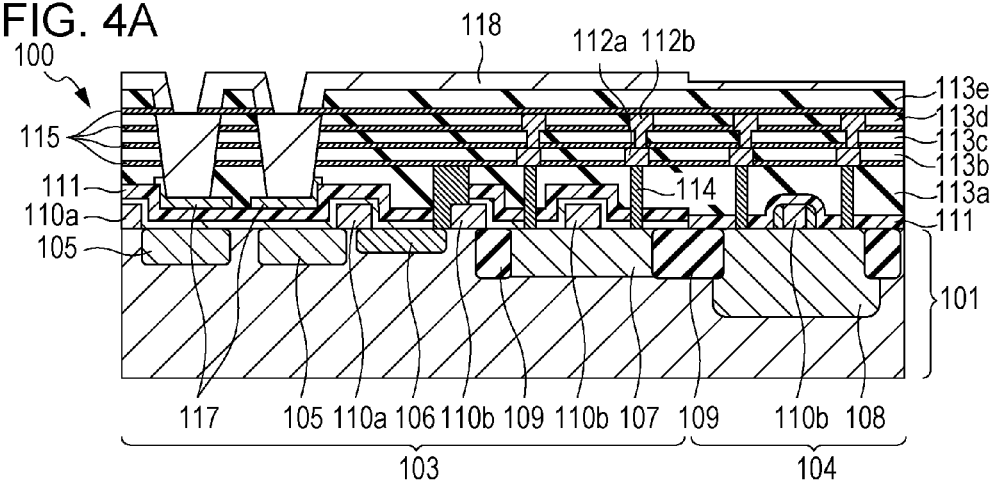
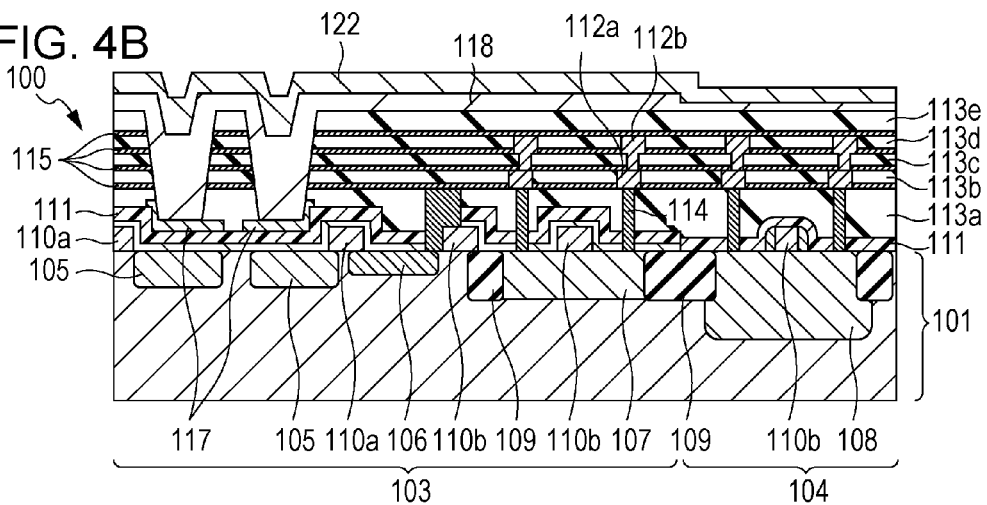
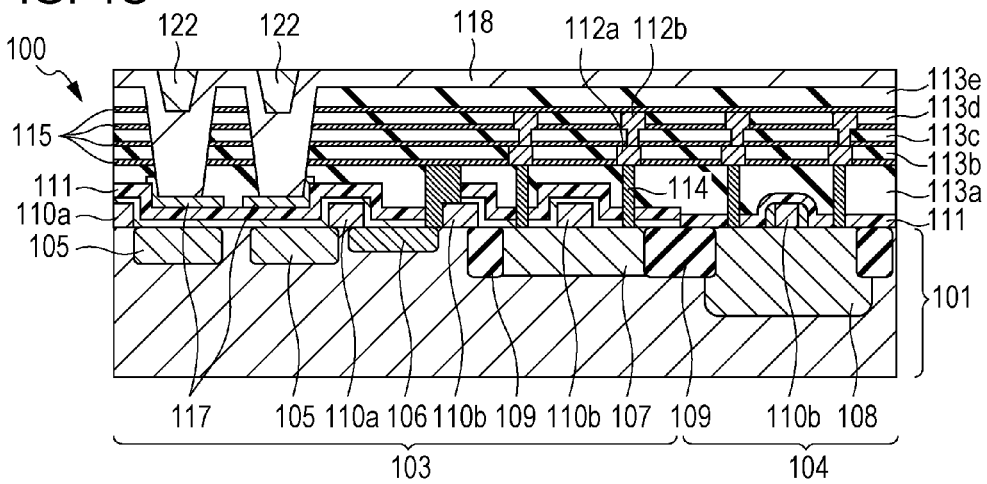

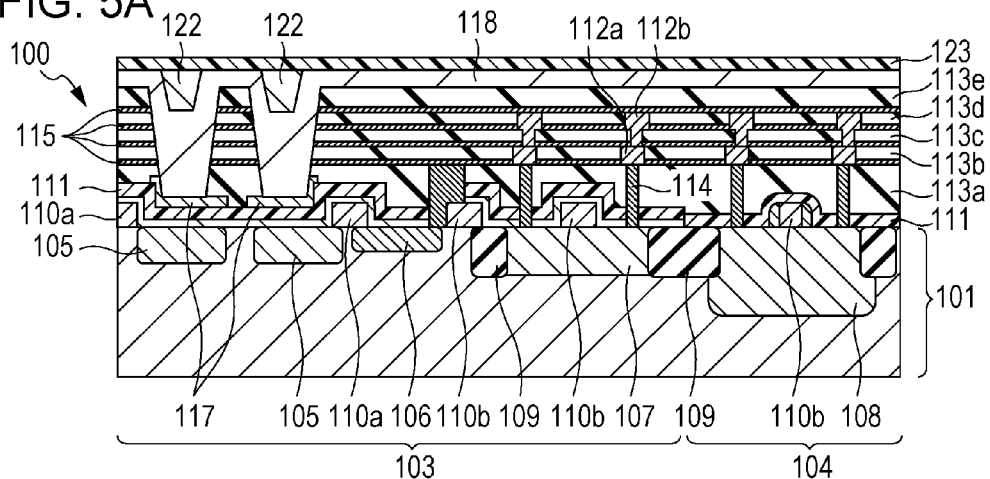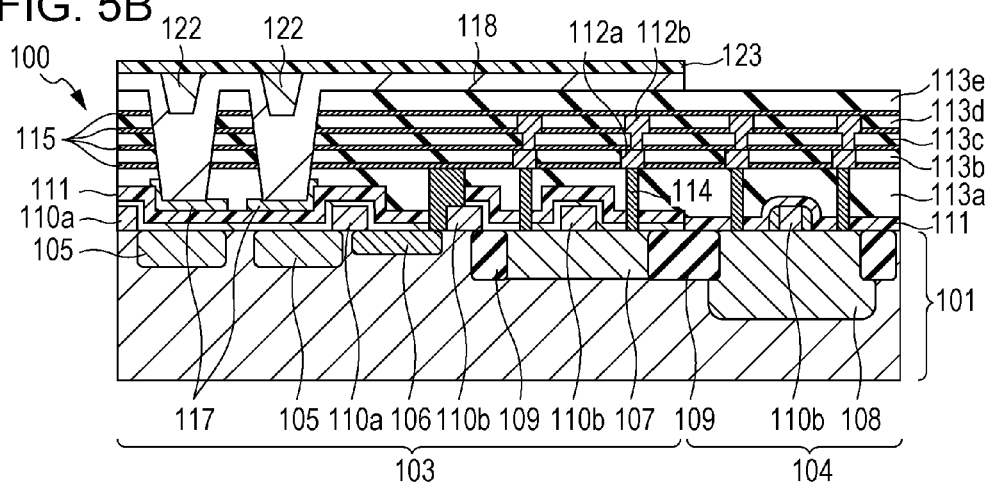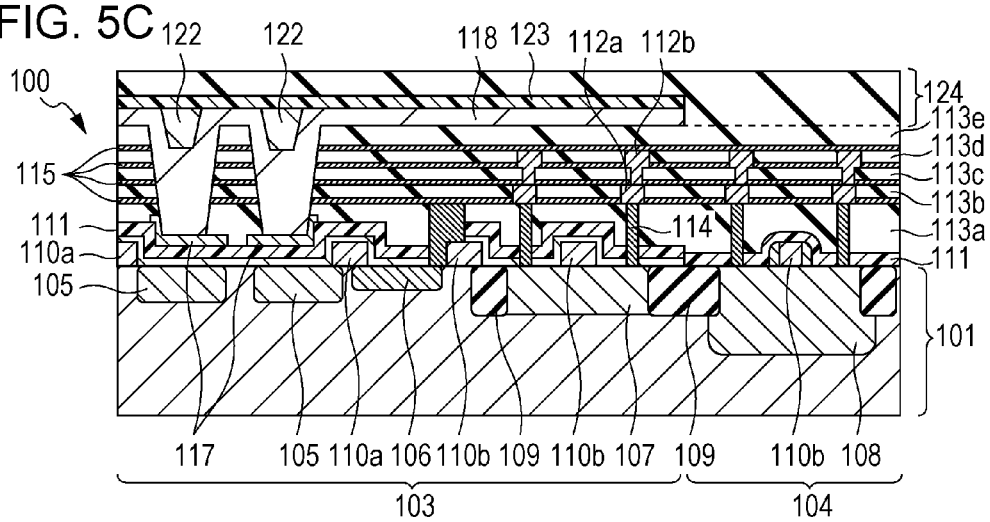

SEMICONDUCTOR DEVICE MANUFACTURING METHOD

CROSS REFERENCE TO RELATED APPLICATIONS

The present application is a Divisional of U.S. patent application Ser. No. 13/366,155 filed Feb. 3, 2012, which claims the benefit of priority from Japanese Patent Application No. 2011-026354 filed Feb. 9, 2011 and Japanese Patent Application No. 2011-223294 filed Oct. 7, 2011. U.S. patent application Ser. No. 13/366,155, Japanese Patent Application No. 2011-026354, and Japanese Patent Application No. 2011-223294 are hereby incorporated by reference herein in their entirety.

BACKGROUND OF THE INVENTION

Field of the Invention

The present invention relates to a semiconductor device manufacturing method.

Description of the Related Art

Regarding solid-state image pickup devices as one type of semiconductor device, a solid-state image pickup device including an optical waveguide has recently been proposed to increase a quantity of light incident on a photoelectric conversion portion.

Japanese Patent Laid-Open No. 2010-103458 discloses a solid-state image pickup device including a waveguide that is made up of a clad layer having a low refractive index, and a core layer having a high refractive index and buried in a groove surrounded by the clad layer. As an exemplary method of manufacturing such a solid-state image pickup device, there is disclosed a method of forming the core layer over an entire surface of the clad layer in which an opening is formed corresponding to the photoelectric conversion portion.

However, the method of manufacturing the solid-state image pickup device, disclosed in Japanese Patent Laid-Open No. 2010-103458, has a difficulty in making the solid-state image pickup device flatter. This results in degradation of image quality. Further, in a semiconductor device other than the solid-state image pickup device, the device height is increased with a higher degree of integration, and a difficulty in reducing the device height in a manufacturing process may become a problem to be overcome.

SUMMARY OF THE INVENTION

One embodiment of the present invention provides a method of manufacturing a semiconductor device. The semiconductor device includes a semiconductor substrate having a first region and a second region, and an insulator disposed on the first region and the second region. The method comprises a first step of forming a plurality of first openings in a first part of the insulator, wherein the first part of the insulator is a part thereof disposed on the first region. The method comprises a second step of, after the first step, forming a first member in each of the plurality of first openings and on a second part of the insulator, wherein the second part of the insulator is a part thereof disposed on the second region. The method comprises a third step of at least partially removing a part of the first member, wherein the part of the first member is a part thereof disposed on the second part of the insulator. The method comprises a fourth step of, after the third step, planarizing an exposed surface above the first region and an exposed surface above the second region.

Another embodiment of the present invention provides a method of manufacturing a semiconductor device. The semiconductor device includes a semiconductor substrate having a first region where a plurality of photoelectric conversion portions is disposed, and a second region where a circuit for processing signals from the plurality of photoelectric conversion portions is disposed. The semiconductor device includes an insulator disposed on the first region and the second region. The method comprises a first step of forming a plurality of first openings in a first part of the insulator such that the plurality of first openings are respectively overlapped with the plurality of photoelectric conversion portions. The method comprises a second step of, after the first step, forming a first member in each of the plurality of first openings and on a second part of the insulator, wherein the second part of the insulator is a part thereof disposed on the second region. The method comprises a third step of at least partially removing a part of the first member, wherein the part of the first member is a part thereof disposed on the second part of the insulator. The method comprises a fourth step of, after the third step, planarizing an exposed surface above the first region and an exposed surface above the second region.

Further features of the present invention will become apparent from the following description of exemplary embodiments with reference to the attached drawings.

BRIEF DESCRIPTION OF THE DRAWINGS

FIG. 4A illustrates a method of manufacturing a solid-state image pickup device according to a second embodiment.

FIG. 4B illustrates the method of manufacturing the solid-state image pickup device according to the second embodiment.

FIG. 4C illustrates the method of manufacturing the solid-state image pickup device according to the second embodiment.

FIG. 5A illustrates the method of manufacturing the solid-state image pickup device according to the second embodiment.

FIG. 5B illustrates the method of manufacturing the solid-state image pickup device according to the second embodiment.

FIG. 5C illustrates the method of manufacturing the solid-state image pickup device according to the second embodiment.

FIG. 6A illustrates the method of manufacturing the solid-state image pickup device according to the second embodiment.

FIG. 6B illustrates the method of manufacturing the solid-state image pickup device according to the second embodiment.

FIG. 6C illustrates the method of manufacturing the solid-state image pickup device according to the second embodiment.

DESCRIPTION OF THE EMBODIMENTS

Figure 1A:
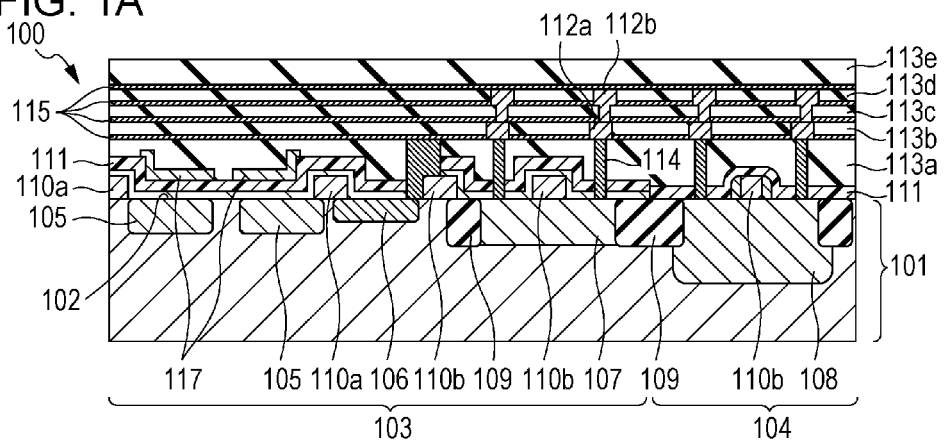
FIG. 1A illustrates a method of manufacturing a solid-state image pickup device according to a first embodiment.

The present invention is concerned with a semiconductor device manufacturing method. More specifically, the manufacturing method can be applied to a construction in which an insulator on a semiconductor substrate has a first region where a plurality of openings is disposed at a first density, and a second region where a plurality of openings is disposed at a second density smaller than the first density, the plurality of openings in the first region being filled with a filling member. The second density may be zero. In such a construction, a film thickness of the filling member is reduced only in the second region.

Embodiments of the present invention can be applied to, for example, a method of manufacturing a solid-state image pickup device. The solid-state image pickup device is a semiconductor device including a semiconductor substrate on which a plurality of photoelectric conversion portions is disposed. More specifically, the manufacturing method is applicable to the case that optical waveguides are formed, for example, by forming openings respectively corresponding to the plurality of photoelectric conversion portions and filling a high refractive-index material in the openings. In that case, the above-mentioned second region corresponds to a peripheral region where a circuit for processing signals generated in the photoelectric conversion portions is disposed. Thus, in the peripheral region, the openings for forming the optical waveguides are usually not formed or, even if formed, at a smaller density than that in an image pickup region.

An embodiment of the present invention will be described below, by way of example, in connection with the method of manufacturing the solid-state image pickup device. A semiconductor substrate 101 includes an image pickup region 103 where a plurality of photoelectric conversion portions 105 is disposed, and a peripheral region 104 where a circuit for processing signals from the photoelectric conversion portions 105 is disposed. An insulator is disposed on the semiconductor substrate 101. The insulator includes, e.g., a plurality of interlayer insulating films 113a to 113e.

First, openings 116 are formed in the insulator. In the insulator, the openings 116 are formed at positions respectively overlying the plural photoelectric conversion portions 105. A large number of photoelectric conversion portions 105 can be disposed in the image pickup region 103. Thus, a density of the openings 116 is higher in the image pickup region 103 than in the peripheral region 104.

Next, a first waveguide member 118 is formed on the insulator in which the openings are formed. The first waveguide member 118 is formed on the insulator, which is disposed on the image pickup region 103, such that the first waveguide member 118 fills the insides of the openings 116. The first waveguide member 118 is further formed on the insulator that is disposed on the peripheral region 104. At that time, it is not necessarily required that the insides of the openings 116 are entirely filled with the first waveguide member 118. A void may be left in a part of the inside of the opening 116.

A part of the first waveguide member 118, which part is disposed in the peripheral region 104 as viewed from above (i.e., above the peripheral region 104), is removed. For example, etching or liftoff can be used as a method of removing the first waveguide member 118. The part of the first waveguide member 118, which part is removed, will be described below from the viewpoints of looking the relevant part from above (in a plan view) and in the direction of depth thereof.

As viewed in a plan view, the part of the first waveguide member 118, which part is disposed in the peripheral region 104, is removed at least partially. In one embodiment, the part of the first waveguide member 118, disposed in the peripheral region 104, is mostly removed. Moreover, the part of the first waveguide member 118, disposed in the peripheral region 104, may entirely remove.

Regarding the extent of removal in the depth direction, at least a part of the first waveguide member 118 is removed. In other words, a film thickness of the first waveguide member 118 disposed in the peripheral region 104 is reduced. The first waveguide member 118 is removed to such an extent that the first waveguide member 118 is partially left and the underlying insulator is not exposed. However, the first waveguide member 118 may be entirely removed in the depth direction. In other words, the first waveguide member 118 may be removed until the underlying insulator is exposed.

After removing the part of the first waveguide member 118, which part is disposed in the peripheral region 104, the image pickup region 103 and the peripheral region 104 are planarized, or flattened.

Beneficial effect obtained with the above-described manufacturing method is as follows. When the first waveguide member 118 is formed in separate surfaces on which the openings 116 are disposed at densities much different from each other, such as represented by the image pickup region 103 and the peripheral region 104, a large level difference occurs between the surface in which the density of the openings 116 is high and the surface in which the density of the openings 116 is low. For that reason, the level difference cannot be satisfactorily reduced by a planarizing step that is carried out in the related art.

In contrast, according to the embodiment of the present invention, the part of the first waveguide member 118, which part is disposed in the peripheral region 104, is removed. The part of the first waveguide member 118, disposed in the peripheral region 104, corresponds to a part locating at a higher level. With such a removing step, the level difference between the image pickup region 103 and the peripheral region 104 can be reduced to some extent before the start of the planarizing step. As a result, an exposed surface can be satisfactorily planarized, or flattened, in the subsequent planarizing step.

Generally, in a method of manufacturing a semiconductor device, a plurality of chips is formed on one wafer. In a solid-state image pickup device, particularly, the image pickup region 103 and the peripheral region 104 are alternately disposed at a relatively long period. Therefore, the level difference also tends to occur at a relatively long period. It is difficult to reduce that type of the level difference by CMP (Chemical Mechanical Polishing), for example. Thus, the above-mentioned problem with the planarizing step is more significant in the related-art method of manufacturing the solid-state image pickup device. For that reason, applying the embodiment of the present invention to the method of manufacturing the solid-state image pickup device is highly beneficial.

It is to be noted that the embodiment of the present invention is not limited to the method of manufacturing the solid-state image pickup device. For example, when a wiring is formed by the damascene process described later, a metal film is formed on an insulator in which openings are formed. At that time, if there is a distribution in density of the openings formed in the insulator, the metal film may be formed relatively thin in a portion where the density of the openings is high, and relatively thick in a portion where the density of the openings is low. The damascene process is widely used as a method of forming a wiring in not only the solid-state image pickup device, but also in general semiconductor devices. The embodiment of the present invention can be applied to processes for manufacturing those semiconductor devices with intent to reduce the level difference.

While the following description is made on the case where an electron is a signal charge, the signal charge may be a hole. When the hole is the signal charge, the following description is similarly adaptable just by reversing the conductivity type of each semiconductor region.

First Embodiment

A method of manufacturing a solid-state image pickup device, according to a first embodiment of the present invention, will be described below with reference to the drawings. FIGS. 1A to 1C and 2A to 2C are schematic views of a cross-sectional structure of the solid-state image pickup device in successive steps of the manufacturing method according to the first embodiment.

A solid-state image pickup device 100 includes a semiconductor substrate 101. The semiconductor substrate 101 is a portion, which is made of a semiconductor material, among components constituting the solid-state image pickup device. The semiconductor substrate involves a substrate that is obtained by forming, in a semiconductor wafer, a semiconductor region with an ordinary semiconductor manufacturing process. The semiconductor material is, e.g., silicon. An interface between the semiconductor material and another material is a principal surface 102 of the semiconductor substrate 101. The other material is, e.g., a thermally oxidized film that is disposed on the semiconductor substrate in contact with the semiconductor substrate.

In this embodiment, an ordinary semiconductor substrate can be used as the semiconductor substrate 101. P-type semiconductor regions and N-type semiconductor regions are disposed in the semiconductor substrate 101. Reference numeral 102 denotes the principal surface of the semiconductor substrate 101. In this embodiment, the principal surface 102 of the semiconductor substrate 101 is provided by an interface between the semiconductor substrate 101 and the thermally oxidized film (not shown) stacked on the semiconductor substrate 101. The semiconductor substrate 101 includes an image pickup region 103 where a plurality of pixels is disposed, and a peripheral region 104 where a signal processing circuit for processing signals from the pixels is disposed. The image pickup region 103 and the peripheral region 104 are described later.

It is to be noted that, in this specification, the term "plane" implies a plane parallel to the principal surface 102. For example, the principal surface 102 in a region where photoelectric conversion portions (described later) are disposed, or the principal surface 102 in a channel of a MOS transistor may be regarded as a reference. In this specification, the term "cross-section" implies a plane crossing the above-defined plane.

In steps until obtaining the structure illustrated in FIG. 1A, the semiconductor regions are formed in the semiconductor substrate 101, and gate electrodes and multilayer wirings are formed on the semiconductor substrate 101. Photoelectric conversion portions 105, a floating diffusion (hereinafter abbreviated to "FD") 106, and source/drain regions in a well 107 for a pixel transistor are formed in the image pickup region 103 of the semiconductor substrate 101. The photoelectric conversion portions 105 are each, for example, in the form of a photodiode. The photoelectric conversion portion 105 includes the N-type semiconductor region disposed in the semiconductor substrate 101. Electrons generated by photoelectric conversion are collected in the N-type semiconductor region of the photoelectric conversion portion 105. The FD 106 is made of another N-type semiconductor region. The electrons generated in the photoelectric conversion portion 105 are transferred to the FD 106 and are converted to a voltage. The FD 106 is electrically connected to an input node of an amplification portion. Alternatively, the FD 106 may be electrically connected to a signal output line. In this embodiment, the FD 106 is electrically connected to a gate electrode 110b of an amplification transistor via a plug 114. Source and drain regions of the amplification transistor for amplifying a signal, source and drain regions of a reset transistor for resetting an input node of the amplification transistor, etc. are formed in the well 107 for the pixel transistor. A well 108 for a peripheral transistor is formed in the peripheral region 104 of the semiconductor substrate 101. Source and drain regions of the peripheral transistor, which constitutes the signal processing circuit, are formed in the well 108 for the peripheral transistor. In addition, an element isolation portion 109 may be formed in the semiconductor substrate 101. The element isolation portion 109 electrically isolates the pixel transistor or the peripheral transistor from the other elements. The element isolation portion 109 is formed by, e.g., STI (Shallow Trench Isolation) or LOCOS (LOCal Oxidation of Silicon).

Further, in the steps until obtaining the structure illustrated in FIG. 1A, transfer gate electrodes 110a and gate electrodes 110b are formed. The transfer gate electrodes 110a and the gate electrodes 110b are disposed on the semiconductor substrate 101 with oxide films (not shown) interposed therebetween. Each of the transfer gate electrodes 110a controls transfer of charges between the photoelectric conversion portion 105 and the FD 106. The gate electrodes 110b serve as respective gates of the pixel transistor and the peripheral transistor.

Moreover, in the steps until obtaining the structure illustrated in FIG. 1A, a protective layer 111 is formed on the semiconductor substrate 101. The protective layer 111 is, e.g., a silicon nitride film. The protective layer 111 may be made up of plural layers including a silicon nitride film and a silicon oxide film. Also, the protective layer 111 may have the function of reducing damage that is possibly exerted on the photoelectric conversion portions in subsequent steps. Alternatively, the protective layer 111 may have the antireflective function. Alternatively, the protective layer 111 may have the function of preventing diffusion of a metal in a silicide forming step. Further, an etch stop member 117 is formed on a surface of the protective layer 111 on the side opposite to the semiconductor substrate 101. In one embodiment, the etch stop member 117 has a larger area than that of the bottom of the opening 116 that is formed in a later step. It is to be noted that the protective layer 111 and the etch stop member 117 are not necessarily required.

Then, the first wiring layer 112a, the second wiring layer 112b, and the plural interlayer insulating films 113a to 113e are formed. In this embodiment, the first wiring layer 112a and the second wiring layer 112b are formed by the damascene process. For convenience of explanation, the plural interlayer insulating films are called the first to fifth interlayer insulating films 113a to 113e successively from the side closest to the semiconductor substrate 101.

The first interlayer insulating film 113a is formed in the image pickup region 103 and the peripheral region 104. A surface of the first interlayer insulating film 113a on the side opposite to the semiconductor substrate 101 may be planarized, or flattened, as required. Through-holes are formed in the first interlayer insulating film 113a. Plugs 114 for electrically connecting the electroconductive members in the first wiring layer 112a and the semiconductor regions of the semiconductor substrate 101 are disposed in the through-holes. The plugs 114 are each made of an electroconductive material. The plug 114 is made of, e.g., tungsten.

Next, the second interlayer insulating film 113b is formed on a surface of the first interlayer insulating film 113a on the side opposite to the semiconductor substrate 101. Parts of the second interlayer insulating film 113b, which parts correspond to regions where the electroconductive members in the first wiring layer 112a are to be disposed, are removed by etching. Thereafter, a metal film serving as a material of the first wiring layer 112a is formed in the image pickup region 103 and the peripheral region 104. Thereafter, the metal film is removed by CMP, for example, until the second interlayer insulating film 113b is exposed. With the above-described procedures, the electroconductive members constituting the wiring in the first wiring layer 112a are disposed in a predetermined pattern.

Then, the third interlayer insulating film 113c and the fourth interlayer insulating film 113d are successively formed in the image pickup region 103 and the peripheral region 104. Parts of the fourth interlayer insulating film 113d, which parts correspond to the regions where the electroconductive members in the second wiring layer 112b are to be disposed, are removed by etching. Next, parts of the third interlayer insulating film 113c, which parts correspond to the regions where plugs for electrically connecting the electroconductive members in the first wiring layer 112a and the electroconductive members in the second wiring layer 112b are to be disposed, are removed by etching. Thereafter, a metal film serving as a material of both the second wiring layer 112b and the plugs is formed in the image pickup region 103 and the peripheral region 104. Thereafter, the metal film is removed by CMP, for example, until the fourth interlayer insulating film 113d is exposed. With the above-described procedures, a wiring pattern for the second wiring layer 112b and a pattern for the plugs are obtained. Alternatively, after forming the third interlayer insulating film 113c and the fourth interlayer insulating film 113d, the parts corresponding to the regions where the plugs for electrically connecting the electroconductive members in the first wiring layer 112a and the electroconductive members in the second wiring layer 112b are to be disposed may be removed earlier by etching.

Finally, the fifth interlayer insulating film 113e is formed in the image pickup region 103 and the peripheral region 104. A surface of the fifth interlayer insulating film 113e on the side opposite to the semiconductor substrate 101 may be planarized, or flattened, by CMP, for example.

The first wiring layer 112a and the second wiring layer 112b may be formed by some other method than the damascene process. One example of the method other than the damascene process is described below. After forming the first interlayer insulating film 113a, the metal film serving as the material of the first wiring layer 112a is formed in the image pickup region 103 and the peripheral region 104. Next, parts of the metal film other than the regions where the electroconductive members in the first wiring layer 112a are to be disposed are removed by etching. As a result, a wiring pattern for the first wiring layer 112a is obtained. Then, after forming the second interlayer insulating film 113b and the third interlayer insulating film 113c, the second wiring layer 112b is formed in a similar manner. After forming the second wiring layer 112b, the fourth interlayer insulating film 113d and the fifth interlayer insulating film 113e are formed. Respective surfaces of the third interlayer insulating film 113c and the fifth interlayer insulating film 113e on the side opposite to the semiconductor substrate 101 may be planarized, or flattened.

The first wiring layer 112a and the second wiring layer 112b are disposed at different heights from the principal surface of the semiconductor substrate 101 as a reference. In this embodiment, the electroconductive members in both the first wiring layer 112a and the second wiring layer 112b are made of copper. The electroconductive members may be made of other material than copper insofar as the material is electrically conductive. Except for the parts electrically interconnected by the plugs, the electroconductive members in the first wiring layer 112a and the electroconductive members in the second wiring layer 112b are insulated from each other by the third interlayer insulating film 113c. It is to be noted that the number of wiring layers is not limited to two, and the wiring layer may be formed as a single layer or three or more layers.

An etch stop film, a metal diffusion preventive film, or a film having both the etch stop function and the metal diffusion preventive function may be disposed between adjacent two of the interlayer insulating films. In this embodiment, the plural interlayer insulating films 113a to 113e are each a silicon oxide film. A silicon nitride film serves as a metal diffusion preventive film for the silicon oxide film. Therefore, a diffusion preventive film 115 is disposed between adjacent two of the interlayer insulating films. The diffusion preventive film 115 is not necessarily required to be disposed.

Figure 1B:
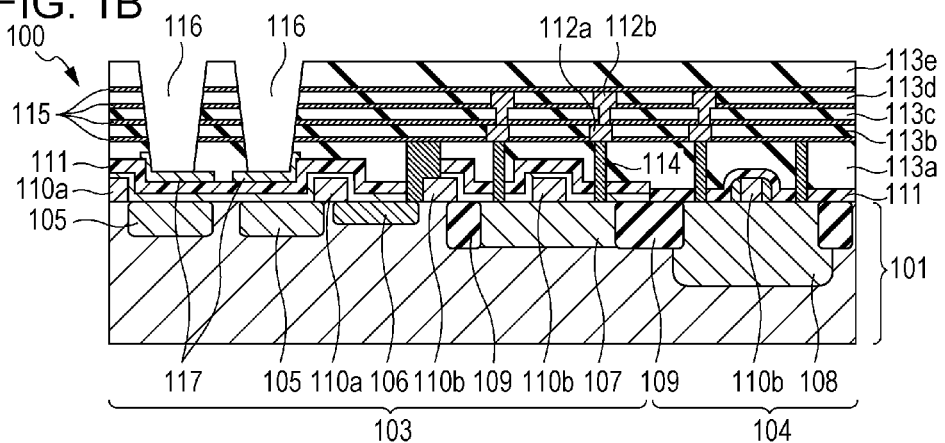
FIG. 1B illustrates the method of manufacturing the solid-state image pickup device according to the first embodiment.

In a step illustrated in FIG. 1B, the openings 116 are each formed through respective regions of the plural interlayer insulating films 113a to 113e, which regions are positioned overlying the photoelectric conversion portions 105. In the case where the diffusion preventive film 115 is disposed, openings are also formed in regions of the diffusion preventive film 115 corresponding to the photoelectric conversion portions 105.

First, a mask pattern (not shown) for etching is stacked on a surface of the fifth interlayer insulating film 113e on the side opposite to the semiconductor substrate 101. The mask pattern for etching is formed except for a region where the opening 116 is to be disposed. In other words, the mask pattern for etching has an opening in the region where the opening 116 is to be disposed. The mask pattern for etching is, for example, a photoresist that is patterned by photolithography and development.

Then, the plural interlayer insulating films 113a to 113e and the diffusion preventives film 115 are etched while the mask pattern for etching is used as a mask. As a result, the opening 116 is formed. Alternatively, the opening 116 may be formed by repeating the etching several times under different conditions. The mask pattern for etching may be removed after the etching.

When the etch stop member 117 is disposed, the etching is performed in the step illustrated in FIG. 1B until the etch stop member 117 is exposed. Under conditions for etching the first interlayer insulating film 113a, an etching rate of the etch stop member 117 is set to be smaller than that of the first interlayer insulating film 113a. When the first interlayer insulating film 113a is a silicon oxide film, the etch stop member 117 can be a silicon nitride film or a silicon oxynitride film. Further, the etch stop member 117 may be exposed by repeating the etching several times under different conditions.

Regarding a cross-sectional shape of the opening 116, the opening 116 is not necessarily required to penetrate through all the first to fifth interlayer insulating films 113a to 113e. The opening 116 may be a recess formed in the fifth interlayer insulating film 113e. Alternatively, the opening 116 may penetrate partially the first to fifth interlayer insulating films 113a to 113e. The opening 116 has such a plan shape that the boundary of the opening 116 has a closed loop, e.g., a circle or a rectangle. Alternatively, the plan shape of the opening 116 may be a groove-like shape extending over two or more photoelectric conversion portions 105. Thus, in this specification, when, in a certain plane, a region where the fifth interlayer insulating film 113e is not disposed is surrounded by or sandwiched between regions where the fifth interlayer insulating film 113e is disposed, it is said that the fifth interlayer insulating film 113e has the opening 116.

When looking at the opening 116 in a plan view, at least a part of the opening 116 is positioned in overlapped relation to the photoelectric conversion portion 105. In other words, when the opening 116 and the photoelectric conversion portion 105 are projected to the same plane, projected regions of both the opening 116 and the photoelectric conversion portion 105 overlap with each other in the same plane.

In this embodiment, the opening 116 is formed in the region overlapping with the photoelectric conversion portion 105, and the opening 116 is not formed in the peripheral region 104. However, the opening 116 may be formed in the peripheral region 104. In that case, a density of the openings 116 formed in the image pickup region 103 is set to be higher than that of the openings 116 formed in the peripheral region 104. The density of the openings 116 can be determined as the number of openings 116 disposed per unit area. Alternatively, the density of the openings 116 may be determined as a proportion of areas occupied by the openings 116.

Figure 1C:
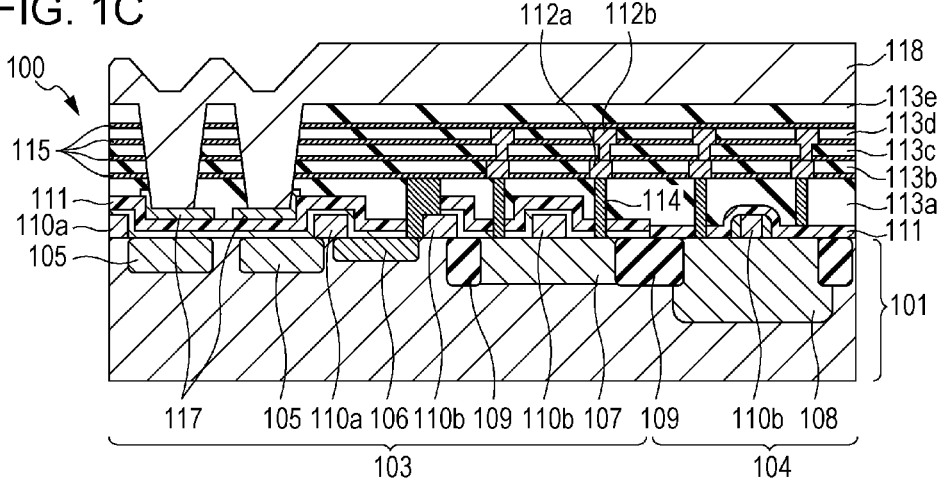
FIG. 1C illustrates the method of manufacturing the solid-state image pickup device according to the first embodiment.

In a step illustrated in FIG. 1C, the first waveguide member 118 is formed inside the openings 116 and on the fifth interlayer insulating film 113e. More specifically, the first waveguide member 118 is formed in the image pickup region 103 and the peripheral region 104. The first waveguide member 118 can be formed, for example, by a film forming process, such as CVD (Chemical Vapor Deposition) or sputtering, or by coating an organic material such as represented by a polyimide-based high polymer. The first waveguide member 118 may be formed through plural steps under different conditions. In that case, for example, the first waveguide member 118 may be formed in a first step under the condition suitable for increasing adhesion with respect to the underlying layer, and the first waveguide member 118 may be formed in a subsequent step under the condition suitable for improving a characteristic for filling the inside of the opening 116. Alternatively, the first waveguide member 118 may be formed by forming different types of materials in order. For example, the first waveguide member 118 may be formed by first depositing a silicon nitride film, and then depositing an organic material with a higher filling characteristic. When the first interlayer insulating film 113a has been etched in the step of FIG. 1B until the etch stop member 117 is exposed, the first waveguide member 118 is disposed in contact with the etch stop member 117.

The material of the first waveguide member 118 is to have a higher refractive index than that of the material of the interlayer insulating films 113a to 113e. When the interlayer insulating films 113a to 113e are silicon oxide films, the material of the first waveguide member 118 can be, e.g., a silicon nitride film or a polyimide-based organic material. The refractive index of the silicon nitride film is in the range of 1.7 to 2.3. The refractive index of the surrounding silicon oxide film is in the range of 1.4 to 1.6. Therefore, light incident on the interface between the first waveguide member 118 and each of the interlayer insulating films 113a to 113e is reflected on the basis of the Snell's law. As a result, the light can be enclosed inside the first waveguide member 118. Further, the hydrogen content of the silicon nitride film can be increased such that dangling bonds in the substrate are terminated by the hydrogen supply effect. This is effective in reducing noise, such as white defects. The refractive index of the polyimide-based organic material is about 1.7. The filling characteristic of the polyimide-based organic material is superior to that of the silicon nitride film. It is desirable that the material of the first waveguide member 118 is suitably selected in consideration of balance between optical characteristics, such as difference in refractive index, and the beneficial effect from the viewpoint of the manufacturing process.

The positional relationships between the plural interlayer insulating films 113a to 113e and the first waveguide member 118 filled in the opening 116 will be described below. In a certain plane, the region where the first waveguide member 118 is disposed is surrounded by or sandwiched between the regions where the plural interlayer insulating films 113a to 113e are disposed. In other words, respective first parts of the plural interlayer insulating films 113a to 113e, respective second parts thereof differing from the first parts, and the first waveguide member 118 filled in the opening 116 are positioned in a line in a direction crossing the direction in which the photoelectric conversion portion 105 and the first waveguide member 118 filled in the opening 116 are positioned in a line. The direction crossing the direction in which the photoelectric conversion portion 105 and the first waveguide member 118 filled in the opening 116 are positioned in a line is, for example, a direction parallel to the principal surface 102 of the semiconductor substrate 101.

The first waveguide member 118 is disposed at a position overlying the photoelectric conversion portion 105 on the semiconductor substrate 101. The plural interlayer insulating films 113a to 113e are disposed around the first waveguide member 118. The refractive index of the material forming the first waveguide member 118 is higher than that of the material forming the plural interlayer insulating films 113a to 113e. With that relationship in refractive index, of the light incident on the first waveguide member 118, a quantity of light leaking to the plural interlayer insulating films 113a to 113e can be reduced. Therefore, when at least a part of the first waveguide member 118 is disposed in overlapped relation to the photoelectric conversion portion 105, a quantity of light incident on the photoelectric conversion portion 105 can be increased.

The refractive index of the first waveguide member 118 is not always needed to be higher than that of the plural interlayer insulating films 113a to 113e. The first waveguide member 118 can function as an optical waveguide insofar as the light incident on the first waveguide member 118 does not leak to the surrounding insulator. For example, a member for reflecting the incident light may be formed on an inner sidewall of the opening 116, and the first waveguide member 118 may be filled in the remaining inside of the opening 116. Alternatively, an air gap may exist between the first waveguide member 118 filled in the opening 116 and the plural interlayer insulating films 113a to 113e. The air gap may be held in a vacuum state or may be filled with a gas. In such a case, the refractive index of the material forming the first waveguide member 118 and the refractive index of the material forming the plural interlayer insulating films 113a to 113e may be set in any magnitude relationship therebetween.

Figure 2A:
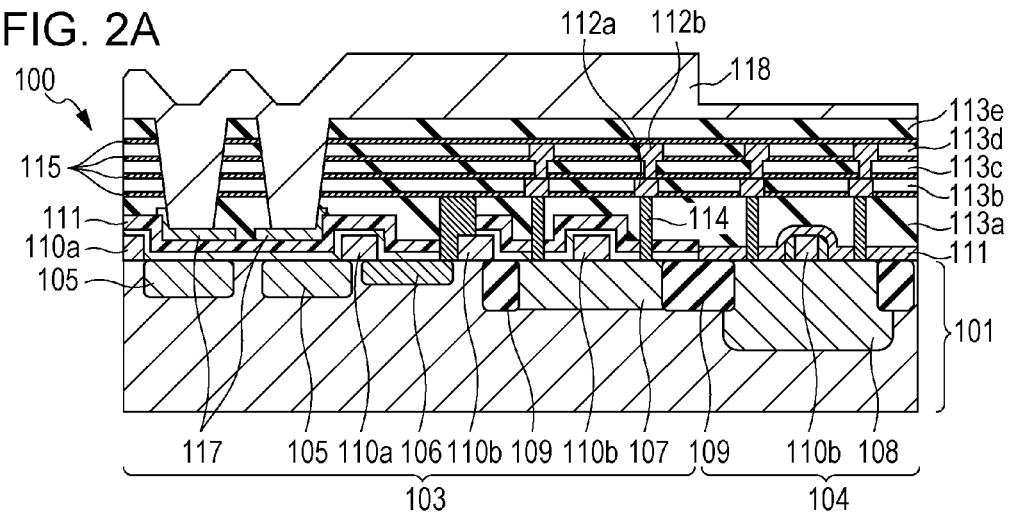
FIG. 2A illustrates the method of manufacturing the solid-state image pickup device according to the first embodiment.

Next, in a step illustrated in FIG. 2A, a part of the first waveguide member 118, which part is disposed in the peripheral region 104, is removed. In this step, an etching mask (not shown) is first stacked on the first waveguide member 118. The etching mask has an opening at a position corresponding to the peripheral region 104. The part of the first waveguide member 118, disposed in the peripheral region 104, is then removed by etching.

At that time, the part of the first waveguide member 118, which part is disposed in the peripheral region 104, is etched away such that the first waveguide member 118 is left in a predetermined film thickness. With the presence of the first waveguide member 118 in the predetermined film thickness, damage possibly exerted on the semiconductor substrate side by the etching can be reduced. As an alternative, the first waveguide member 118 may be removed until the fifth interlayer insulating film 113e is exposed.

In this embodiment, the part of the first waveguide member 118, which part is disposed over the entire peripheral region 104, is etched. Stated another way, the etching mask is not disposed in the peripheral region 104. Thus, it is desirable that a relatively large area is etched. However, the part of the first waveguide member 118, disposed in the peripheral region 104, may be partially removed. Herein, the term "area" implies an area measured in the plane.

The method of removing the part of the first waveguide member 118, which part is disposed in the peripheral region 104, is not limited to the etching. For example, liftoff may be used to remove that part of the first waveguide member 118. In the case of liftoff, more specifically, an underlying film is formed in the peripheral region 104 before forming the first waveguide member 118. By removing the underlying film after forming the first waveguide member 118, the first waveguide member 118 disposed on the underlying film is also removed at the same time.

In the step illustrated in FIG. 2A, a part of the first waveguide member 118, which part is disposed in the image pickup region 103, may also be removed.

Figure 2B:
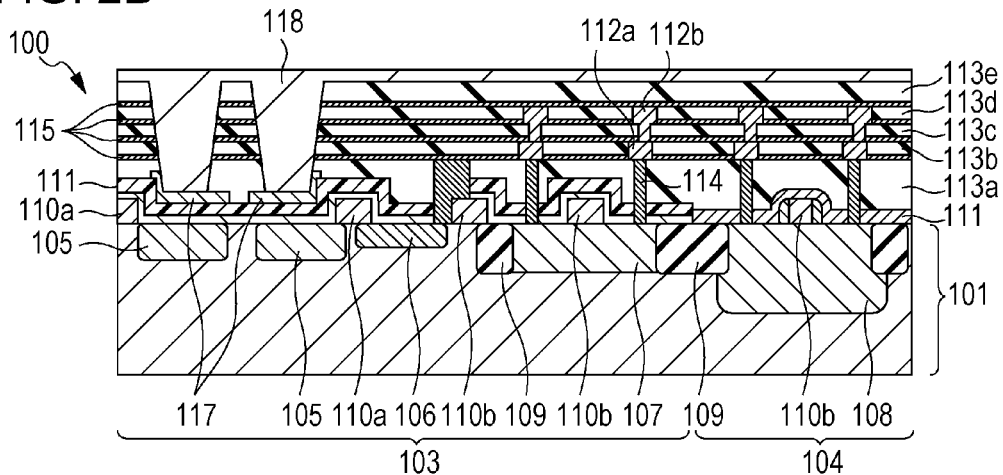
FIG. 2B illustrates the method of manufacturing the solid-state image pickup device according to the first embodiment.

In a step illustrated in FIG. 2B, the surface of the first waveguide member 118 on the side opposite to the semiconductor substrate 101 is planarized, or flattened. The planarizing of the first waveguide member 118 is performed by, e.g., CMP, polishing, or etching. In this embodiment, the first waveguide member 118 is planarized, or flattened by CMP.

In the step illustrated in FIG. 2B, the surface of the first waveguide member 118 on the side opposite to the semiconductor substrate 101 is not necessarily to be completely flat. A level difference in the surface of the first waveguide member 118 on the side opposite to the semiconductor substrate 101 before the planarizing is reduced by the planarizing step. For example, in the peripheral region 104, a film thickness of the first waveguide member 118 after the planarizing may be in the range of 200 nm to 500 nm. Also, in a zone of the image pickup region 103 where the openings 116 are not disposed, a film thickness of the first waveguide member 118 after the planarizing may be in the range of 50 nm to 350 nm.

In this embodiment, the surface of the first waveguide member 118 on the side opposite to the semiconductor substrate 101 is exposed when the planarizing step is performed. Therefore, the exposed surface of the first waveguide member 118 disposed above the image pickup region 103 (i.e., in the image pickup region 103 as viewed from above) and the exposed surface of the first waveguide member 118 disposed above the peripheral region 104 (i.e., in the peripheral region 104 as viewed from above) are planarized, or flattened. When another member is formed on the first waveguide member 118, an exposed surface of the other member is planarized, or flattened. As an alternative, when the first waveguide member 118 is removed in the step of FIG. 2A until the underlying fifth interlayer insulating film 113e is exposed, an exposed surface of the fifth interlayer insulating film 113e is planarized, or flattened.

The planarizing in the step of FIG. 2B may be performed such that the level difference between the exposed surface positioned above the image pickup region 103 and the exposed surface positioned above the peripheral region 104 is reduced. Alternatively, the planarizing may be performed in a plane including the exposed surface positioned above the image pickup region 103, while the planarizing may be performed in a plane including the exposed surface positioned above the peripheral region 104.

Figure 2C:
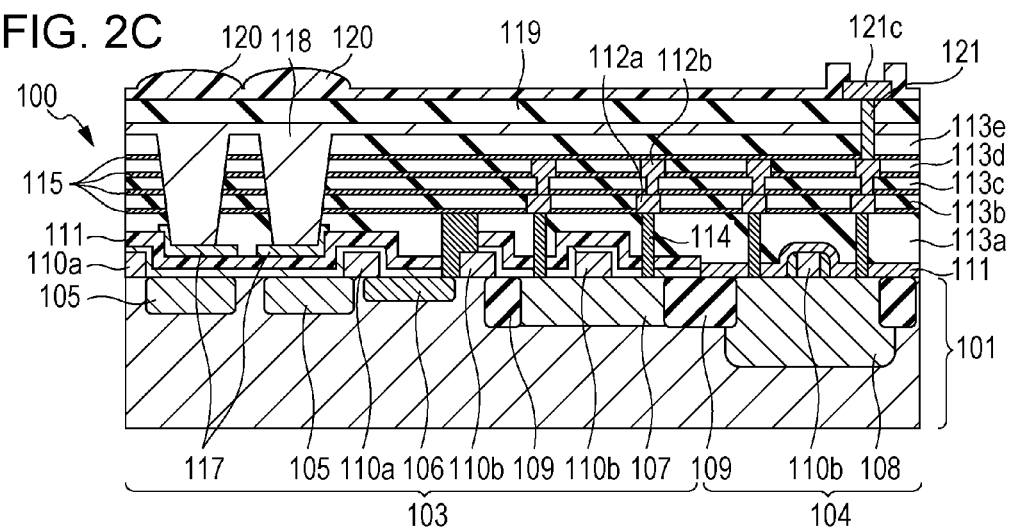
FIG. 2C illustrates the method of manufacturing the solid-state image pickup device according to the first embodiment.

Next, in steps until obtaining the structure illustrated in FIG. 2C, a sixth interlayer insulating film 119, a third wiring layer 121c, and in-layer lenses 120 are formed. First, the sixth interlayer insulating film 119 is formed on the first waveguide member 118. The sixth interlayer insulating film 119 is made of the same material as that of the fifth interlayer insulating film 113e. In this embodiment, the sixth interlayer insulating film 119 is a silicon oxide film. A through-hole is then formed in which a plug 121 for electrically connecting a predetermined electroconductive member in the second wiring layer 112b and a predetermined electroconductive member in the third wiring layer 121c is to be disposed. The plug 121 is then formed in the through-hole.

Next, the third wiring layer 121c is formed. In this embodiment, the electroconductive member in the third wiring layer 121c is made of aluminum. The third wiring layer 121c can be formed by using, as appropriate, the manner that has been described above in the step of forming the first wiring layer 112a or the second wiring layer 112b.

Further, the in-layer lenses 120 are formed. The in-layer lenses 120 are disposed respectively corresponding to the photoelectric conversion portions 105. The in-layer lenses 120 are each formed of, e.g., a silicon nitride film. The in-layer lenses 120 can be formed by using one of ordinary methods. Thereafter, color filters, microlenses, etc. are formed, above the in-layer lenses 120 on the side opposite to the semiconductor substrate 101.

Figure 3:
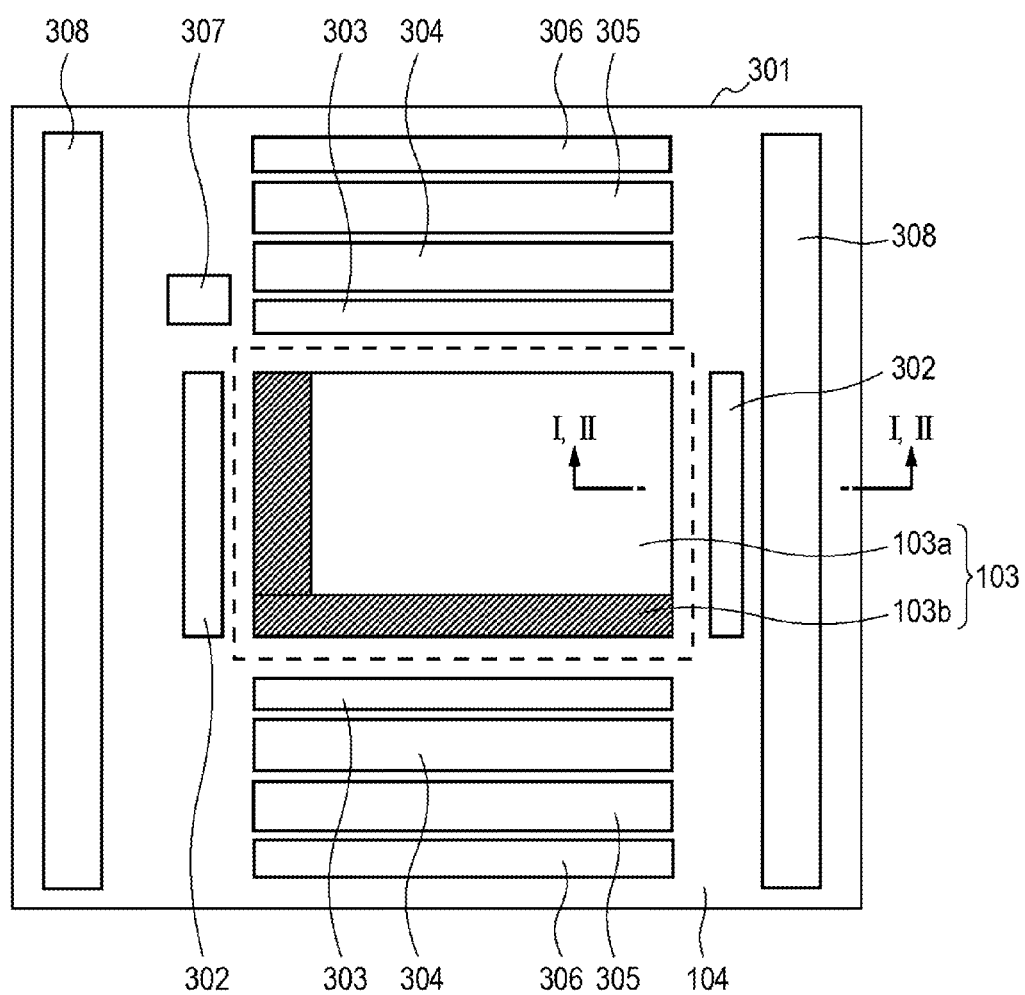
FIG. 3 is a schematic view of a planar structure of the solid-state image pickup device according to the first embodiment.

FIG. 3 is a schematic view of a planar structure of the solid-state image pickup device according to the first embodiment. A cross-section taken along a line I, II-I, II in FIG. 3 is illustrated in FIGS. 1A to 2C.

In FIG. 3, the solid-state image pickup device 100 includes the image pickup region 103 and the peripheral region 104. The image pickup region 103 may further include a light-receiving region 103a and a light-shielding region 103b. Many pixels are two-dimensionally arrayed in the image pickup region 103. The photoelectric conversion portions of the pixels arrayed in the light-shielding region 103b are shielded against light. Signals from the pixels in the light-shielding region 103b can be used as a reference for a black level.

The peripheral region 104 is a region other than the image pickup region 103. In this embodiment, a vertical scanning circuit 302, a horizontal scanning circuit 303, a column amplifier 304, a column ADC (Analog to Digital Converter) 305, a memory 306, a timing generator 307, and a plurality of pads 308 are disposed in the peripheral region 104. Those circuits, etc. serve to process signals from the pixels. Some of those circuits, etc. may be dispensed with.

In this embodiment, the region where the first waveguide member 118 is removed is denoted as a region 301 outside dotted lines in FIG. 3. As illustrated in FIG. 3, most of the peripheral region 104 is provided as the above-mentioned region 301.

In this embodiment, at the time of forming the first waveguide member 118, the openings 116 are already formed in the surface that is to be positioned under the first waveguide member 118. The openings 116 are disposed only in the image pickup region 103. Alternatively, the density of the openings 116 disposed in the image pickup region 103 is higher than that of the openings 116 disposed in the peripheral region 104. The first waveguide member 118 is formed in a larger thickness in the region where a smaller number of openings 116 are formed than in the region where a larger number of openings 116 are formed. Therefore, a level difference occurs between the region where a larger number of openings 116 are formed (i.e., the image pickup region 103) and the region where a smaller number of openings 116 are formed (i.e., the peripheral region 104). Such a level difference can be reduced by removing the part of the first waveguide member 118, which part is disposed in the peripheral region 104.

Modification of First Embodiment

After the step illustrated in FIG. 2B, i.e., after the planarizing of the first waveguide member 118, a part of the first waveguide member 118, which part is formed in the peripheral region 104, may be removed as an additional step. Particularly, in the additional step the first waveguide member 118 in part, which is disposed at the position where the plug 121 is to be disposed, and which is disposed within the predetermined distance from the position where the plug 121 is to be disposed, is removed. Thereafter, the sixth interlayer insulating film 119 is formed.

By performing the above-described step, it becomes easier to form the through-hole in which the plug 121 is to be disposed. The reason is discussed in brief below. If the first waveguide member 118 is not removed before forming the sixth interlayer insulating film 119, the fifth interlayer insulating film 113e, the first waveguide member 118, and the sixth interlayer insulating film 119 are present in the state stacked in this order from the side closer to the semiconductor substrate 101. Given such a structure, three removing steps (e.g., three etching steps) under different conditions suitable for respective layers are used to form the through-hole. In contrast, by removing the first waveguide member 118 and then forming the sixth interlayer insulating film 119, a structure is obtained in which the fifth interlayer insulating film 113e and the sixth interlayer insulating film 119 are stacked in this order from the side closer to the semiconductor substrate 101 in the region where the through-hole is to be formed. Thus, the removing step to form the through-hole can be performed under the same condition by using the same material to form the fifth interlayer insulating film 113e and the sixth interlayer insulating film 119. Accordingly, the through-hole can be formed by two removing steps including the earlier step of removing the first waveguide member 118.

Second Embodiment

A method of manufacturing the solid-state image pickup device, according to a second embodiment of the present invention, will be described below with reference to FIGS. 4A to 6C. FIGS. 4A to 6C are schematic views of a cross-sectional structure of the solid-state image pickup device in successive steps of the manufacturing method according to the second embodiment. It is to be noted that components in FIGS. 4A to 6C having the same functions as those in FIGS. 1A to 2C are denoted by the same reference symbols and detailed description of those components is omitted.

FIG. 4A illustrates the same step as that illustrated in FIG. 2A regarding the first embodiment. In other words, FIG. 4A illustrates the state where the part of the first waveguide member 118, which part is formed in the peripheral region 104, has been removed. Steps in the manufacturing method according to the second embodiment until the step illustrated in FIG. 4A are the same as those illustrated in FIGS. 1A to 2A regarding the first embodiment.

In a step illustrated in FIG. 4B, a second waveguide member 122 is formed on a surface of the first waveguide member 118 on the side opposite to the semiconductor substrate 101. The second waveguide member 122 is formed in the image pickup region 103 and the peripheral region 104. In this embodiment, the step of forming the first waveguide member 118 and the step of forming the second waveguide member 122 differ from each other in that the step of removing the part of the first waveguide member 118, which part is disposed in the peripheral region 104, has been performed before the step of forming the second waveguide member 122. Thus, the second waveguide member 122 may be formed by using the same material as that of the first waveguide member 118. Further, the second waveguide member 122 may be formed in the same manner as that in forming the first waveguide member 118. Alternatively, the second waveguide member 122 may be formed by using a different material from that of the first waveguide member 118, and the second waveguide member 122 may be formed in a different manner from that in forming the first waveguide member 118.

In this embodiment, the first waveguide member 118 and the second waveguide member 122 are made of the same material. More specifically, the second waveguide member 122 is made of silicon nitride. In that case, the second waveguide member 122 can be formed by CVD or sputtering. As an alternative, the second waveguide member 122 may be formed by coating an organic material represented by a polyimide-based high polymer.

In this embodiment, the first waveguide member 118 and the second waveguide member 122 are both formed by CVD. However, process conditions for the CVD differ between both the cases. The second waveguide member 122 may be formed by carrying out plural steps under different conditions. Further, the second waveguide member 122 may be formed by coating plural different kinds of materials in order.

FIG. 4C illustrates a planarizing step after forming the second waveguide member 122. In this embodiment, a surface of the second waveguide member 122 on the side opposite to the semiconductor substrate 101 is planarized, or flattened, by CMP. The planarizing can be performed by one of ordinary methods. For example, the planarizing may be performed by polishing or etching. The first waveguide member 118 or some other member positioned on the side closer to the semiconductor substrate 101 than the second waveguide member 122 may be exposed by the planarizing. In this embodiment, the first waveguide member 118 is exposed in the peripheral region 104. The second waveguide member 122 is left in the image pickup region 103. However, the second waveguide member 122 may be left in the peripheral region 104 as well.

In the step illustrated in FIG. 4C, the surface of the second waveguide member 122 on the side opposite to the semiconductor substrate 101 is not necessarily required to be completely flat. It is just required that a level difference in the surface of the second waveguide member 122 on the side opposite to the semiconductor substrate 101 before the planarizing is reduced by the planarizing step. For example, in the peripheral region 104, a total film thickness of the first waveguide member 118 and the second waveguide member 122 after the planarizing may be in the range of 200 nm to 500 nm. Also, in a zone of the image pickup region 103 where the openings 116 are not disposed, a total film thickness of the first waveguide member 118 and the second waveguide member 122 after the planarizing may be in the range of 50 nm to 350 nm.

In this embodiment, the surface of the second waveguide member 122 on the side opposite to the semiconductor substrate 101 is exposed when the planarizing step is performed. When another member is formed on the second waveguide member 122, an exposed surface of the other member is planarized, or flattened.

In a step illustrated in FIG. 5A, a low refractive-index member 123 is formed. The refractive index of the low refractive-index member 123 is lower than that of the member which is disposed on the side closer to the semiconductor substrate 101 than the low refractive-index member 123 and which is positioned in contact with the low refractive-index member 123. In other words, the member disposed on the side closer to the semiconductor substrate 101 than the low refractive-index member 123 and positioned in contact with the low refractive-index member 123 is a member that is exposed at the time of forming the low refractive-index member 123. In this embodiment, both the first waveguide member 118 and the second waveguide member 122 correspond to the above-mentioned member. Thus, in this embodiment, the refractive index of the low refractive-index member 123 is lower than those of the first waveguide member 118 and the second waveguide member 122. In practice, the low refractive-index member 123 is formed of a silicon oxynitride film. The silicon oxynitride film has a refractive index of about 1.72. It is to be noted that the low refractive-index member 123 is not necessarily required. When the low refractive-index member 123 is not disposed, the step illustrated in FIG. 5A can be omitted.

In a step illustrated in FIG. 5B, a part of the first waveguide member 118, which part is formed in the peripheral region 104, a part of the second waveguide member 122, which part is formed in the peripheral region 104, or both the parts are removed. Particularly, in this step the first waveguide member 118 and the second waveguide member 122 in respective parts, which are disposed at the position where a plug 121 (described later) is to be disposed, and which are disposed within a predetermined distance from the position where the plug 121 is to be disposed, is removed. Further, when the low refractive-index member 123 is disposed, a part of the low refractive-index member 123, which part is disposed in the peripheral region 104, is also removed.

Depending on the steps prior to this step, one of the first waveguide member 118 and the second waveguide member 122 may be not disposed in the peripheral region 104. In such a case, the other of the first waveguide member 118 and the second waveguide member 122, which is disposed in the peripheral region 104, is removed.

The removing step can be performed by using one of ordinary methods. In this embodiment, the respective parts of the first waveguide member 118, the second waveguide member 122 and the low refractive-index member 123, which parts are formed in the peripheral region 104, are removed by etching, for example.

In a step illustrated in FIG. 5C, a seventh interlayer insulating film 124 is formed. The seventh interlayer insulating film 124 is formed of the same material as that of the fifth interlayer insulating film 113e. A surface of the seventh interlayer insulating film 124 on the side opposite to the semiconductor substrate 101 may be planarized, or flattened, when necessary.

By performing the steps illustrated in FIGS. 5B and 5C, it becomes easier to form a through-hole 125 (described later) in which the plug 121 is to be disposed. The reason is discussed in brief below. If the first waveguide member 118, the second waveguide member 122, and the low refractive-index member 123 are not removed before forming the seventh interlayer insulating film 124, the first waveguide member 118, the second waveguide member 122, and the low refractive-index member 123 are present between the fifth interlayer insulating film 113e and the seventh interlayer insulating film 124. Given such a structure, removing steps (e.g., etching steps) under different conditions suitable for respective layers are used in some cases to form the through-hole 125. In contrast, by removing the first waveguide member 118, the second waveguide member 122, and the low refractive-index member 123 before forming the seventh interlayer insulating film 124 and then forming the seventh interlayer insulating film 124, the fifth interlayer insulating film 113e and the seventh interlayer insulating film 124 are disposed in contact with each other in the region where the through-hole 125 is to be formed. Thus, the step of forming the through-hole 125 can be performed with one process by using the same material to form the fifth interlayer insulating film 113e and the seventh interlayer insulating film 124. Accordingly, the through-hole 125 can be formed by two removing steps including the earlier step of removing the first waveguide member 118. As a result, the through-hole 125 can be more easily formed and the manufacturing steps are simplified.

Figures 6A, 6B, 6C:
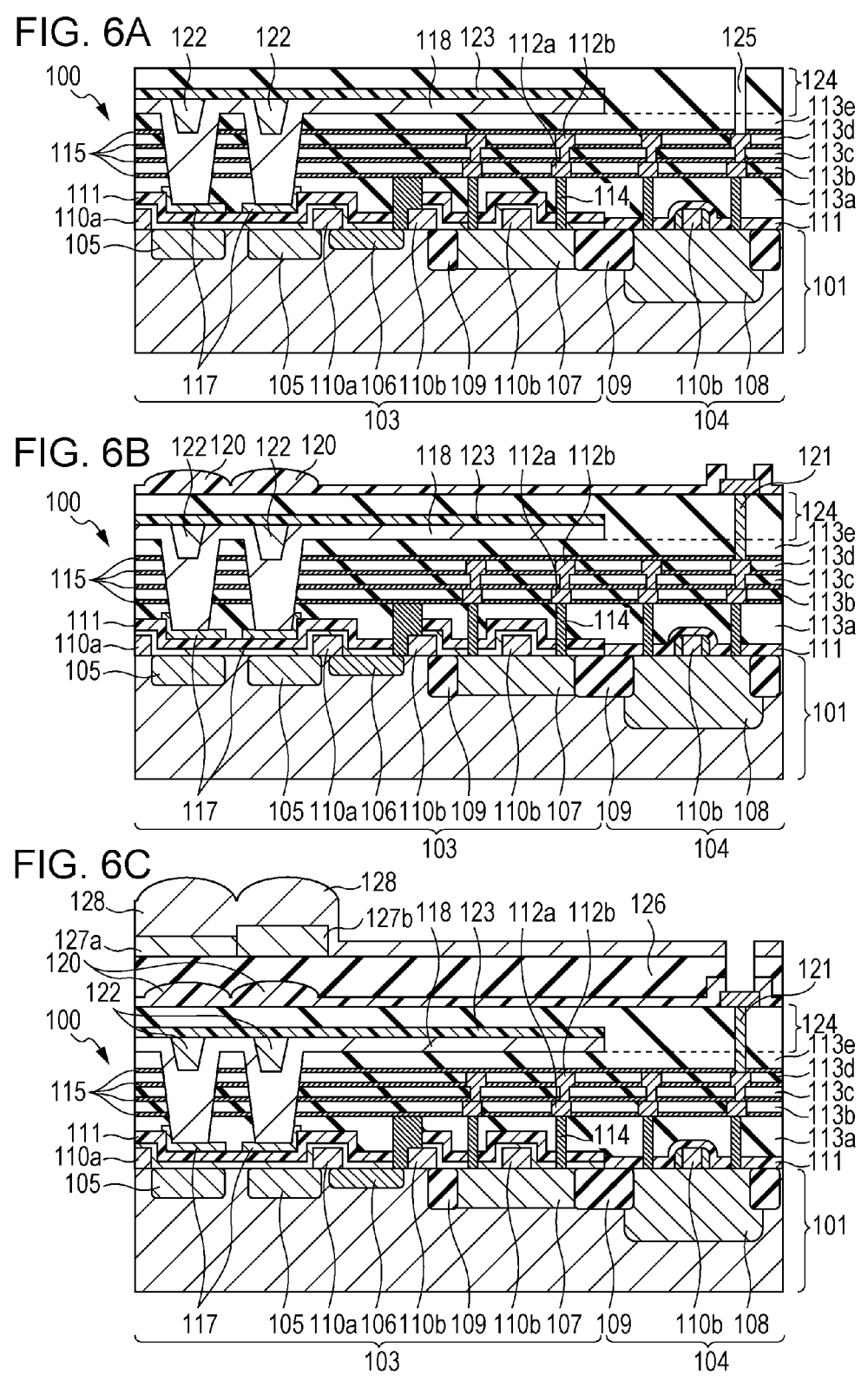

In a step illustrated in FIG. 6A, the through-hole 125 is formed in the seventh interlayer insulating film 124 at a position overlying the predetermined electroconductive member in the second wiring layer 112b. The through-hole 125 is formed by etching, for example.

In steps until obtaining the structure illustrated in FIG. 6B, a third wiring layer 121c and in-layer lenses 120 are formed. First, the plug 121 is formed in the through-hole 125. The plug 121 electrically connects the predetermined electroconductive member in the second wiring layer 112*b* and a predetermined electroconductive member in the third wiring layer 121*c*.

Next, the third wiring layer 121*c* is formed. In this embodiment, the electroconductive member in the third wiring layer 121*c* is made of aluminum. The third wiring layer 121*c* can be formed by using, as appropriate, the manner that has been described above in the step of forming the first wiring layer 112*a* or the second wiring layer 112*b*. The electroconductive member in the third wiring layer 121*c* may be made of a metal other than aluminum.

Further, in the steps until obtaining the structure illustrated in FIG. 6B, the in-layer lenses 120 are formed. The in-layer lenses 120 are disposed respectively corresponding to the photoelectric conversion portions 105. The in-layer lenses 120 are each formed of, e.g., a silicon nitride film. The in-layer lenses 120 can be formed by using one of ordinary methods. In this embodiment, the material forming the in-layer lenses 120 is disposed in the peripheral region 104 as well. However, the material forming the in-layer lenses 120 may be disposed only in the image pickup region 103.

Between the in-layer lenses 120 and the seventh interlayer insulating film 124, an intermediate member having an intermediate refractive index between the refractive indices of the former twos may be disposed. In this embodiment, a silicon oxynitride film (not shown) is disposed between the in-layer lenses 120 and the seventh interlayer insulating film 124. More specifically, the refractive index of the silicon nitride film (i.e., the in-layer lens 120) is about 2.00, the refractive index of the silicon oxynitride film (i.e., the intermediate member) is about 1.72, and the refractive index of the silicon oxide film (i.e., the seventh interlayer insulating film 124) is about 1.45.

The above-described arrangement is effective in reducing reflectivity. That point is discussed in brief below. Generally, when light propagates from a medium having a refractive index of n1 to a medium having a refractive index of n2, the reflectivity increases as the difference between n1 and n2 increases. When the intermediate member having the intermediate refractive index is disposed between the in-layer lenses 120 and the seventh interlayer insulating film 124, the difference in refractive index at an interface between adjacent two is reduced. As a result, the reflectivity when light enters the seventh interlayer insulating film 124 from the in-layer lens 120 can be reduced in comparison with that when the in-layer lens 120 and the seventh interlayer insulating film 124 are disposed in direct contact with each other. Similarly, with the provision of, between the seventh interlayer insulating film 124 and the second waveguide member 122, the low refractive-index member 123 having an intermediate refractive index between the refractive indices of the former two, the refractive index at an interface between adjacent twos is reduced. As a result, the reflectivity when light enters the second waveguide member 122 from the seventh interlayer insulating film 124 can be reduced.

The extent of reduction in the reflectivity resulting from the provision of the intermediate member varies depending on the relationship among a film thickness d of the intermediate member, a refractive index N of the intermediate member, and a wavelength p of the incident light. The reason is that multiple-reflected lights from plural interfaces cancel each other. Theoretically, given that k is an arbitrary integer equal to or more than 0, the reflectivity is minimized when the condition expressed by the following formula (1) is satisfied:

$$d = \frac{p}{4N}(2k+1) \tag{1}$$

Stated another way, the reflectivity is theoretically minimized when the film thickness of the intermediate member is an odd multiple of p/4N. Accordingly, the film thickness of the intermediate member can be set on the basis of the above formula (1). In particular, the film thickness of the intermediate member satisfies the following formula (2). In one embodiment, k=0 is satisfied in the formula (2).

$$\frac{p}{4N}(2k+0.5) < d < \frac{p}{4N}(2k+1.5) \tag{2}$$

Let here suppose, e.g., an example in which the refractive index of the seventh interlayer insulating film 124 is 1.45, the refractive index of the intermediate member is 1.72, the refractive index of the in-layer lens 120 is 2.00, and the wavelength of the incident light is 550 nm. On that condition, when the film thickness of the intermediate member is 80 nm, the transmittance of light transmitting from the in-layer lens 120 to the seventh interlayer insulating film 124 is about 1.00. On the other hand, when the in-layer lens 120 and the seventh interlayer insulating film 124 are disposed in direct contact with each other, the transmittance is about 0.97.

In steps until obtaining the structure illustrated in FIG. 6C, color filters 127*a* and 127*b* and microlenses 128 are formed. First, an eighth insulating film 126 is formed on surfaces of the in-layer lenses 120 on the side opposite to the semiconductor substrate 101. The eighth insulating film 126 is made of, e.g., an organic material. A surface of the eighth insulating film 126 on the side opposite to the semiconductor substrate 101 is planarized, or flattened. The eighth insulating film 126 having the planarized surface on the side opposite to the semiconductor substrate 101 can be formed, for example, by coating the organic material that is used to form the eighth insulating film 126.

Next, the color filters 127*a* and 127*b* are formed. The color filters 127*a* and 127*b* are disposed corresponding to the photoelectric conversion portions 105. The wavelength of light passing through the color filter 127*a* may differ from that of light passing through the color filter 127*b*. Then, the microlenses 128 are formed on surfaces of the color filters 127*a* and 127*b* on the side opposite to the semiconductor substrate 101. The microlenses 128 can be formed by using one of ordinary methods.

With the manufacturing method according to this embodiment, it becomes easier to planarize the surface of the first waveguide member 118 after the first waveguide member 118 has been formed. Therefore, when the in-layer lenses 120, the color filters 127*a* and 127*b*, and the microlenses 128 are formed, those members can be formed on the underlying layer that has high flatness. Accordingly, the in-layer lenses 120, the color filters 127*a* and 127*b*, and the microlenses 128 can be formed with high accuracy. As a result, image quality can be improved.

Modification of Second Embodiment

In the second embodiment, the planarizing step illustrated in FIG. 4C is performed after forming the second waveguide member 122. However, the planarizing may be performed after the step illustrated in FIG. 4A, and the second waveguide member 122 may be formed thereafter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing a semiconductor device including a semiconductor substrate having a first region where a plurality of photoelectric conversion portions are disposed, and a second region where a circuit for processing signals from the plurality of photoelectric conversion portions is disposed, and
an insulator including a first part disposed on the first region and a second part disposed on the second region, the method comprising:
a first step of forming a plurality of first openings in the first part of the insulator, wherein the plurality of first openings are respectively overlapped with the plurality of photoelectric conversion portions;
a second step of, after the first step, forming a first member in each of the plurality of first openings and on the first and second parts of the insulator;
a third step of at least partially removing a part of the first member, the part of the first member being disposed on the second part of the insulator, wherein the first member at least partially remains on the first part of the insulator after the third step; and
a fourth step of, after the third step, forming a second member on the first member and planarizing the second member, resulting in one planar surface across a part of the second member on the first region and a part of the second member on the second region.

2. The method of manufacturing the semiconductor device according to claim 1, further comprising:
a step of, after the fourth step, removing parts of the first and second members, the parts of the first and second members being disposed on the second region.

3. The method according to claim 1, further comprising:
a step of, after the fourth step, removing a part of the second member, the part of the second member being disposed on the second region.

4. The method according to claim 1, wherein a refractive index of the second member is lower than a refractive index of the first member.

5. The method according to claim 1, wherein the first member and the second member are made of a same material.

6. The method according to claim 1, wherein
in the fourth step, the second member is removed so that the part of the first member is exposed, and
the method further comprises a step of,
after the fourth step, removing the part of the first member.

7. The method according to claim 1, wherein
in the third step, the part of the first member is partially removed by etching, and
after the third step, the part of the first member is partially left on the second part of the insulator.

8. The method according to claim 1, wherein the insulator is made up of a plurality of insulating films, and
the plurality of first openings penetrates through the plurality of insulating films.

9. The method according to claim 1, wherein, in the first step, no openings are formed in the second part of the insulator.

10. The method according to claim 1, wherein the first member forms a plurality of optical waveguides.

11. The method according to claim 1, wherein a refractive index of the first member is higher than a refractive index of the insulator.

12. The method according to claim 1, wherein
the semiconductor device includes a wiring formed of a conductive member, and
depths of the plurality of the first openings are larger than a thickness of the conductive member.

13. The method according to claim 1, wherein, after the fourth step, the first member is partially left on the first part of the insulator.

14. The method according to claim 13, wherein the first member left on the first part of the insulator after the fourth step has a thickness within a range from 50 nanometer to 350 nanometer.

15. The method according to claim 1, wherein
the semiconductor device includes an etch stop layer between the insulator and the semiconductor substrate, and
the first step includes a plurality of etching steps performed under different conditions from each other so that each of the plurality of first openings reaches the etch stop layer.

16. The method according to claim 1, wherein
in the fourth step, the second member is removed so that the part of the first member is exposed.

17. The method according to claim 1, wherein, in the fourth step, the second member is planarized by CMP.

18. A method of manufacturing a semiconductor device including a semiconductor substrate having a first region where a plurality of photoelectric conversion portions are disposed, and a second region where a circuit for processing signals from the plurality of photoelectric conversion portions is disposed, and
an insulator including a first part disposed on the first region and a second part disposed on the second region, the method comprising:
a first step of forming a plurality of first openings in the first part of the insulator, wherein the plurality of first openings are respectively overlapped with the plurality of photoelectric conversion portions;
a second step of, after the first step, forming a first member in each of the plurality of first openings and on the first and second parts of the insulator;
a third step of at least partially removing a part of the first member, the part of the first member being disposed on the second part of the insulator, wherein a mask covers, at least on the first region, the first member when removing the part of the first member; and
a fourth step of, after the third step, forming a second member on the first member and planarizing the second member, resulting in one planar surface across a part of the second member on the first region and a part of the second member on the second region.

19. The method of manufacturing the semiconductor device according to claim 18, further comprising:
a step of, after the fourth step, removing parts of the first and second members, the parts of the first and second members being disposed on the second region.

20. The method according to claim 18, further comprising:

a step of, after the fourth step, removing a part of the second member, the part of the second member being disposed on the second region.

21. The method according to claim 18, wherein the first member and the second member are made of a same material.

22. The method according to claim 18, wherein a refractive index of the second member is lower than a refractive index of the first member.

23. The method according to claim 18, wherein
in the fourth step, the second member is removed so that the part of the first member is exposed, and
the method further comprises a step of, after the fourth step, removing the part of the first member.

24. The method according to claim 18, wherein
in the third step, the part of the first member is partially removed by etching, and
after the third step, the part of the first member is partially left on the second part of the insulator.

25. The method according to claim 18, wherein the first member forms a plurality of optical waveguides.

26. The method according to claim 18, wherein a refractive index of the first member is higher than a refractive index of the insulator.

27. The method according to claim 18, wherein, after the fourth step, the first member is partially left on the first part of the insulator.

28. The method according to claim 27, wherein the first member left on the first part of the insulator after the fourth step has a thickness within a range from 50 nanometer to 350 nanometer.

29. The method according to claim 18, wherein
the semiconductor device includes an etch stop layer between the insulator and the semiconductor substrate, and
the first step includes a plurality of etching steps performed under different conditions from each other so that each of the plurality of first openings reaches the etch stop layer.

30. The method according to claim 18, wherein
the semiconductor device includes a wiring formed of a conductive member, and
depths of the plurality of the first openings are larger than a thickness of the conductive member.

31. The method according to claim 18, wherein
in the fourth step, the second member is removed so that the part of the first member is exposed.

32. The method according to claim 18, wherein, in the fourth step, the second member is planarized by CMP.

33. A method of manufacturing a semiconductor device including a semiconductor substrate having a first region where a plurality of photoelectric conversion portions are disposed, and a second region where a circuit for processing signals from the plurality of photoelectric conversion portions is disposed, and
an insulator including a first part disposed on the first region and a second part disposed on the second region, the method comprising:
a first step of forming a plurality of first openings in the first part of the insulator, wherein the plurality of first openings are respectively overlapped with the plurality of photoelectric conversion portions;
a second step of, after the first step, forming a first member in each of the plurality of first openings and on the first and second parts of the insulator;

a third step of at least partially removing a part of the first member by etching, the part of the first member being disposed on the second part of the insulator; and
a fourth step of, after the third step, forming a second member on the first member and planarizing the second member, resulting in one planar surface across a part of the second member on the first region and a part of the second member on the second region.

34. The method of manufacturing the semiconductor device according to claim 33, further comprising:
a step of, after the fourth step, removing parts of the first and second members, the parts of the first and second members being disposed on the second region.

35. The method according to claim 33, further comprising:
a step of, after the fourth step, removing a part of the second member, the part of the second member being disposed on the second region.

36. The method according to claim 33, wherein the first member and the second member are made of a same material.

37. The method according to claim 33, wherein a refractive index of the second member is lower than a refractive index of the first member.

38. The method according to claim 33, wherein
in the fourth step, the second member is removed so that the part of the first member is exposed, and
the method further comprises a step of, after the fourth step, removing the part of the first member.

39. The method according to claim 33, wherein
in the third step, the part of the first member is partially removed by etching, and
after the third step, the part of the first member is partially left on the second part of the insulator.

40. The method according to claim 33, wherein the first member forms a plurality of optical waveguides.

41. The method according to claim 33, wherein a refractive index of the first member is higher than a refractive index of the insulator.

42. The method according to claim 33, wherein, after the fourth step, the first member is partially left on the first part of the insulator.

43. The method according to claim 42, wherein the first member left on the first part of the insulator after the fourth step has a thickness within a range from 50 nanometer to 350 nanometer.

44. The method according to claim 33, wherein
the semiconductor device includes an etch stop layer between the insulator and the semiconductor substrate, and
the first step includes a plurality of etching steps performed under different conditions from each other so that each of the plurality of first openings reaches the etch stop layer.

45. The method according to claim 33, wherein
the semiconductor device includes a wiring formed of a conductive member, and
depths of the plurality of the first openings are larger than a thickness of the conductive member.

46. The method according to claim 33, wherein, in the fourth step, the second member is planarized by CMP.

47. The method according to claim 33, wherein
in the fourth step, the second member is removed so that the part of the first member is exposed.

48. A method of manufacturing a semiconductor device including a semiconductor substrate having a first region and a second region, and an insulator including a first part disposed on the first region and a second part disposed on the second region, the method comprising:

a first step of forming a plurality of first openings in a first part of the insulator;

a second step of, after the first step, forming a first member in each of the plurality of first openings and on the first and second parts of the insulator;

a third step of at least partially removing a part of the first member, the part of the first member being disposed on the second part of the insulator; and a fourth step of, after the third step, forming a second member formed on the first member and planarizing the second member, resulting in one planar surface across a part of the second member on the first region and a part of the second member on the second region, wherein the first member forms a plurality of optical waveguides.

49. The method according to claim 48, wherein in the third step, the part of the first member is removed by etching, and in the fourth step, the first member is planarized by CMP.

* * * * *